US012603647B2

(12) United States Patent
Tsukasa

(10) Patent No.: US 12,603,647 B2
(45) Date of Patent: Apr. 14, 2026

(54) DRIVER CIRCUIT OF SWITCHING TRANSISTOR, LASER DRIVER CIRCUIT, AND CONTROLLER CIRCUIT OF CONVERTER

(71) Applicant: ROHM CO., LTD., Kyoto (JP)

(72) Inventor: Taketo Tsukasa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 129 days.

(21) Appl. No.: 18/442,153

(22) Filed: Feb. 15, 2024

(65) Prior Publication Data

US 2024/0283449 A1 Aug. 22, 2024

(30) Foreign Application Priority Data

Feb. 22, 2023 (JP) ................................. 2023-026605

(51) Int. Cl.
*H03K 17/687* (2006.01)
*H03K 17/16* (2006.01)

(52) U.S. Cl.
CPC ....... *H03K 17/6872* (2013.01); *H03K 17/165* (2013.01); *H03K 2217/0063* (2013.01); *H03K 2217/0072* (2013.01)

(58) Field of Classification Search
CPC ............. H03K 17/6872; H03K 17/165; H03K 2217/0063; H03K 2217/0072
See application file for complete search history.

(56) References Cited

U.S. PATENT DOCUMENTS

| | | | | |
|---|---|---|---|---|
| 8,476,940 B2 * | 7/2013 | Kumar | ..................... | H03K 3/02 |
| | | | | 327/434 |
| 10,931,278 B2 * | 2/2021 | Morinaka | .......... | H03K 17/6872 |
| 2011/0309372 A1 * | 12/2011 | Xin | ..................... | H10D 84/811 |
| | | | | 257/E29.089 |
| 2023/0411927 A1 * | 12/2023 | Jones | ...................... | H03K 4/02 |

FOREIGN PATENT DOCUMENTS

JP 2019134622 A 8/2019

* cited by examiner

*Primary Examiner* — Metasebia T Retebo
(74) *Attorney, Agent, or Firm* — CANTOR COLBURN LLP

(57) ABSTRACT

A driver circuit that drives a switching transistor which is a GaN-HEMT (High Electron Mobility Transistor), includes: an output line connected to a gate of the switching transistor; a low-side line connected to a source of the switching transistor; a high-side line; a first PMOS transistor that is connected between the high-side line and the output line; a first NMOS transistor that is connected between the output line and the low-side line; a second PMOS transistor that is connected between the high-side line and the output line; a second NMOS transistor that is connected between the output line and the low-side line; a third NMOS transistor that is connected between the high-side line and the output line; and a control circuit that generates the P gate signal, the first N gate signal, and the second N gate signal.

14 Claims, 13 Drawing Sheets

DRIVER CIRCUIT OF SWITCHING TRANSISTOR, LASER DRIVER CIRCUIT, AND CONTROLLER CIRCUIT OF CONVERTER

CROSS-REFERENCE TO RELATED APPLICATION

The present invention claims priority under 35 U.S.C. § 119 to Japanese Patent Application No. 2023-026605, filed on Feb. 22, 2023, the entire contents of which are incorporated herein by reference.

TECHNICAL FIELD

The present disclosure relates to a driver circuit of a switching transistor.

BACKGROUND

In recent years, compound semiconductor devices such as SiC (silicon carbide) and GaN (gallium nitride), which have higher power, higher efficiency, and smaller size than conventional silicon MOSFETs (Metal Oxide Semiconductor Field Effect Transistors), have been developed as power transistors.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
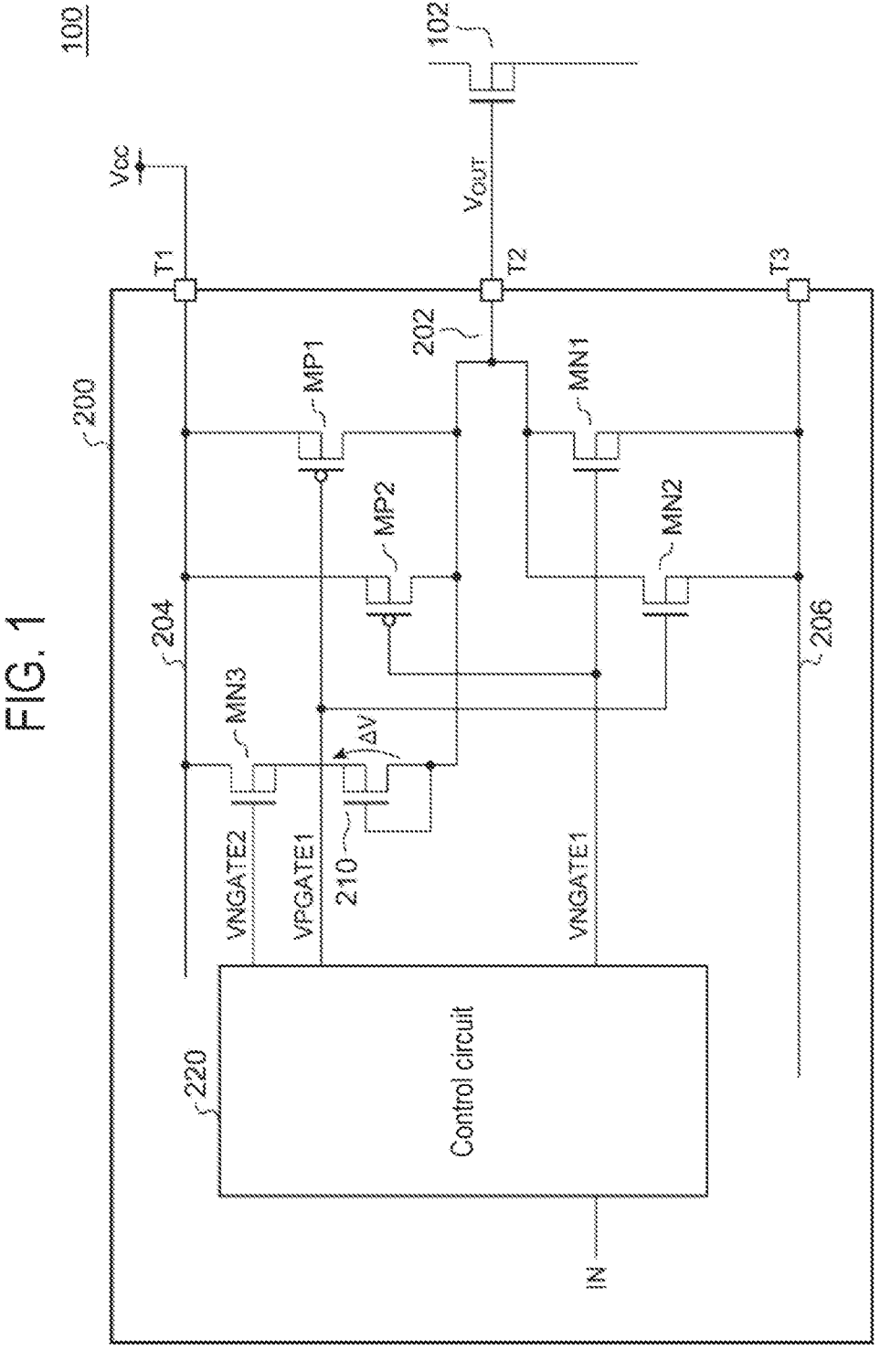
FIG. 1 is a circuit diagram of a switching circuit according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skills in the art that the present disclosure may be practiced without these specific details. In other instances, well-known methods, procedures, systems, and components have not been described in detail so as not to unnecessarily obscure aspects of the various embodiments.

Overview of Embodiments

An overview of some exemplary embodiments of the present disclosure is described. This overview presents, in a simplified form, some concepts of one or more embodiments, as a prologue to the detailed description which will be presented later, for the purpose of basic understanding of the embodiments, but it is not intended to limit the scope of the invention or the disclosure. This overview is not a comprehensive overview of all possible embodiments, and it is intended to neither identify key elements of all embodiments nor delineate the scope of some or all aspects. For the sake of convenience, "an embodiment" may be used to refer to one embodiment (example or modification) or a plurality of embodiments (examples or modifications) disclosed herein.

A driver circuit according to one embodiment drives a switching transistor which is a GaN-HEMT (High Electron Mobility Transistor). The driver circuit includes: an output line connected to a gate of the switching transistor; a low-side line connected to a source of the switching transistor; a high-side line; a first PMOS transistor that is connected between the high-side line and the output line and receives a P gate signal at a gate of the first PMOS transistor; a first NMOS transistor that is connected between the output line and the low-side line and receives a first N gate signal at a gate of the first NMOS transistor; a second PMOS transistor that is connected between the high-side line and the output line and receives the first N gate signal at a gate of the second PMOS transistor; a second NMOS transistor that is connected between the output line and the low-side line and receives the P gate signal at a gate of the second NMOS transistor; a third NMOS transistor that is connected between the high-side line and the output line and receives a second N gate signal at a gate of the third NMOS transistor; and a control circuit that generates the P gate signal, the first N gate signal, and the second N gate signal.

According to this configuration, by appropriately controlling turn-on and turn-off timings of two PMOS transistors and three NMOS transistors, it is possible to suppress ringing of an output voltage caused by a steep current change and ringing of a power supply voltage caused by interruption of a current path during charging of the gate capacitance of the switching transistor.

In one embodiment, in a turn-on operation of the switching transistor, the control circuit may cause the first N gate signal to transition to low, subsequently the second N gate signal to transition to high, and then the P gate signal to transition to low more gradually than the transitions of the first N gate signal and the second N gate signal.

In one embodiment, in a turn-off operation of the switching transistor, the control circuit may cause the P gate signal to gradually transition to high, and then the second N gate signal to transition to low and the first N gate signal to gradually transition to high.

In one embodiment, the driver circuit may further include: a level shift element connected in series with the third NMOS transistor between the high-side line and the output line. As a result, it is possible to lower the voltage level of the output line when the third NMOS transistor is turned off, thereby further suppressing the ringing.

In one embodiment, the level shift element may include a diode.

In one embodiment, the level shift element may be a MOS transistor that can be switched in synchronization with the third NMOS transistor.

In one embodiment, the control circuit may include: a first output inverter whose output is connected to the gate of the first PMOS transistor and the gate of the second NMOS transistor and that outputs the P gate signal; a second output inverter whose output is connected to the gate of the first NMOS transistor and the gate of the second PMOS transistor and that outputs the first N gate signal; and a third output inverter whose output is connected to the gate of the third NMOS transistor and that outputs the second N gate signal. An on-resistance of a PMOS transistor of the second output inverter may be larger than an on-resistance of an NMOS transistor of the second output inverter. As a result, it is possible to make the falling slope of the first N gate signal steep and make the rising slope of the first N gate signal gradual.

In one embodiment, an on-resistance of an NMOS transistor of the first output inverter may be larger than the on-resistance of the NMOS transistor of the second output inverter. As a result, it is possible to make the P gate signal fall gradually.

In one embodiment, an on-resistance of a PMOS transistor of the third output inverter may be smaller than the on-resistance of the PMOS transistor of the second output inverter, and an on-resistance of an NMOS transistor of the third output inverter may be smaller than the on-resistance of the NMOS transistor of the first output inverter. As a result, it is possible to make the second N gate signal fall and rise steeply.

In one embodiment, in the turn-on operation of the switching transistor, a voltage of the output line may rise with a first slope in a first period, rise with a second slope larger than the first slope during a subsequent second period, and rise with a third slope smaller than the second slope during a subsequent third period.

In one embodiment, the length of the second period may be 200 ps to 800 ps.

In one embodiment, the length of the third period may be 1 ns to 5 ns.

In one embodiment, the driver circuit may be monolithically integrated on one semiconductor substrate. The term "monolithically integrated" is intended to include both a case where all circuit elements are formed on a semiconductor substrate and a case where main elements of the circuit are integrated on the semiconductor substrate. In addition, some resistors, capacitors, and the like for adjustment of a circuit constant may be provided outside the semiconductor substrate. By integrating the circuit on one chip, it is possible to reduce the circuit area and keep the characteristics of the circuit elements uniform.

Embodiments

Preferred embodiments of the present disclosure will now be described with reference to the drawings. Like or equivalent components, members, and processes illustrated in each drawing are given like reference numerals and a repeated description thereof will be properly omitted. Further, the embodiments are presented by way of example only and are not intended to limit the present disclosure and invention, and any features or combination thereof described in the embodiments may not necessarily be essential to the present disclosure and invention.

In the present disclosure, "a state where a member A is connected to a member B" includes not only a case where the member A and the member B are physically directly connected, but also a case where the member A and the member B are indirectly connected through any other member that does not substantially affect an electrical connection state between the members A and B or does not impair functions and effects achieved by combinations of the members A and B.

Similarly, "a state where a member C is installed between a member A and a member B" includes not only a case where the member A and the member C or the member B and the member C are directly connected, but also a case where the member A and the member C or the member B and the member C are indirectly connected through any other member that does not substantially affect an electrical connection state between the members A and C or the members B and C or does not impair functions and effects achieved by combinations of the members A and C or the members B and C.

FIG. 1 is a circuit diagram of a switching circuit 100 according to an embodiment. The switching circuit 100 includes a switching transistor 102 and a driver circuit 200. The switching transistor 102 is a GaN-HEMT (High Electron Mobility Transistor).

The driver circuit 200 includes an output line 202, a high-side line 204, a low-side line 206, a first PMOS transistor MP1, a first NMOS transistor MN1, a second PMOS transistor MP2, a second PMOS transistor MP2, a third NMOS transistor MN3, a level shift element 210, and a control circuit 220.

The output line 202 is connected to a gate of the switching transistor 102 via a second terminal T2. The low-side line 206 is connected to the same potential as or a lower potential than a source of the switching transistor 102 via a third terminal T3. The high-side line 204 is connected to a line having a potential (Vcc) higher than the source potential of the switching transistor 102 via a first terminal T1.

The first PMOS transistor MP1 is connected between the high-side line 204 and the output line 202 and receives a P gate signal VPGATE (hereinafter referred to as a VPGATE signal) at a gate of the first PMOS transistor MP1.

The first NMOS transistor MN1 is connected between the output line 202 and the low-side line 206 and receives a first N gate signal VNGATE1 (hereinafter referred to as a VNGATE1 signal) at a gate of the first NMOS transistor MN1.

The second PMOS transistor MP2 is connected between the high-side line 204 and the output line 202 and receives the VNGATE1 signal at a gate of the second PMOS transistor MP2.

The second NMOS transistor MN2 is connected between the output line 202 and the low-side line 206 and receives the P gate signal VPGATE at a gate of the second NMOS transistor MN2.

The third NMOS transistor MN3 is connected between the high-side line 204 and the output line 202 and receives a second N gate signal VNGATE2 (hereinafter referred to as a VNGATE2 signal) at a gate of the third NMOS transistor MN3.

The control circuit 220 generates the VPGATE signal, the VNGATE1 signal, and the VNGATE2 signal according to an input signal IN. The waveform of each signal will be described later.

The level shift element 210 is connected between a source of the third NMOS transistor MN3 and the output line 202. A voltage across the level shift element 210 is maintained at a constant level ΔV. In this embodiment, the level shift element 210 is an NMOS transistor in which a gate of the NMOS transistor and a source of the NMOS transistor are connected and a back gate of the NMOS transistor and a drain of the NMOS transistor are connected. A body diode between the back gate and the source of the NMOS transistor is used as a level shift element, and $\Delta V=Vf$. Vf is the forward voltage of the diode.

The above is a configuration of the switching circuit 100.

Subsequently, the operation of the switching circuit 100 will be described.

Figure 2:
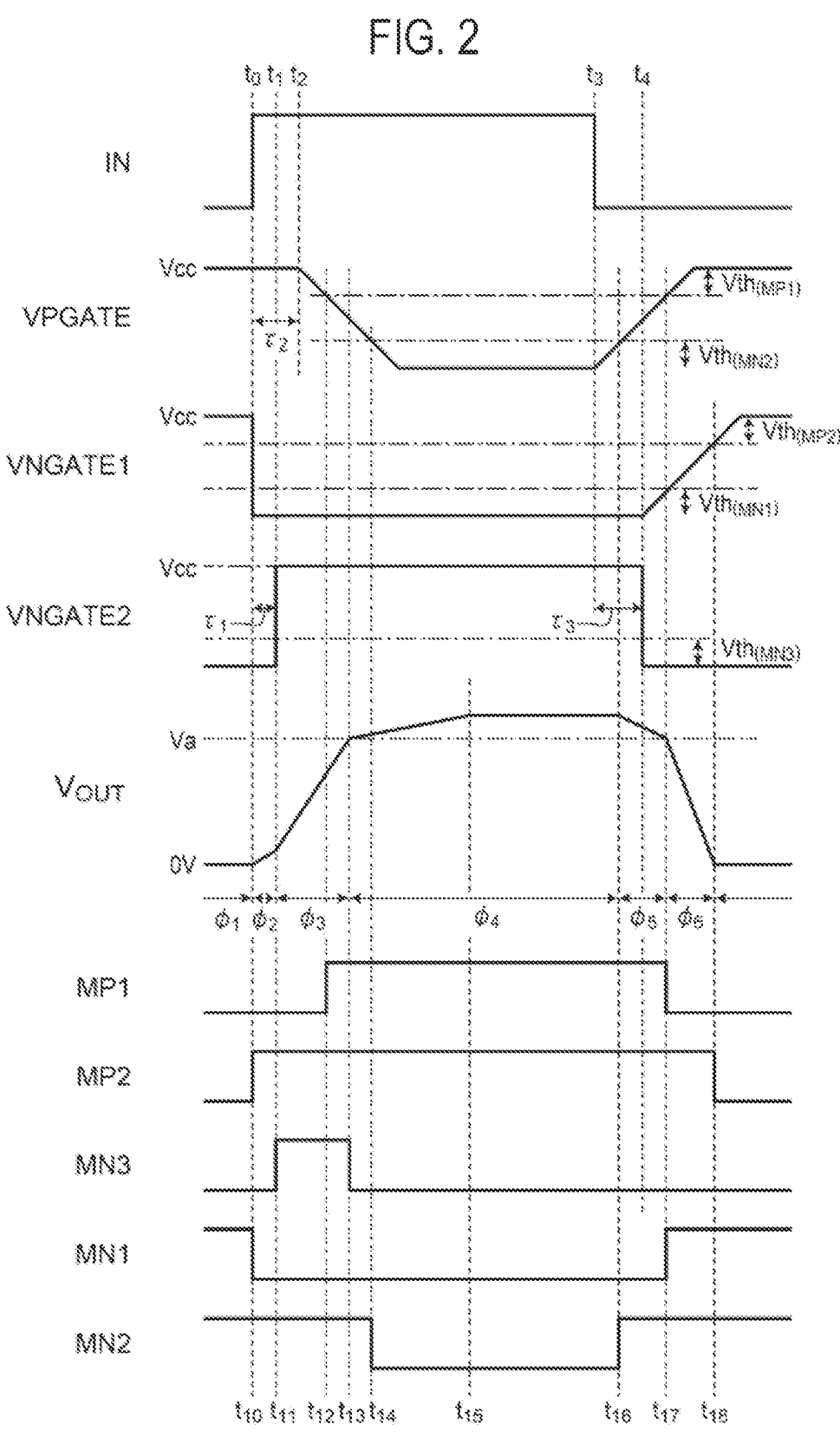
FIG. 2 is an operation waveform diagram of the switching circuit of FIG. 1.

FIG. 2 is an operation waveform diagram of the switching circuit 100 of FIG. 1. First, the control signals VPGATE, VNGATE1, and VNGATE2 generated by the control circuit 220 will be described.

At time $t_0$, when the input signal IN transitions from low to high, the control circuit 220 causes the VNGATE1 signal to transition from high to low at a high speed. The control circuit 220 causes the VNGATE2 signal to transition from low to high at a high speed at time $t_1$ after a delay time $\tau_1$ has elapsed from the transition of the input signal IN. The control circuit 220 causes the VPGATE signal to gradually transition from high to low at time $t_2$ after a delay time $\tau_2$ ($\tau_2 > \tau_1$) has elapsed from the transition of the input signal IN.

At time $t_3$, when the input signal IN transitions from high to low, the control circuit 220 causes the VPGATE signal to gradually transition from low to high. The control circuit 220 causes the VNGATE1 signal to gradually transition from low to high and the VNGATE2 signal to gradually transition from high to low at time $t_4$ after a delay time $\tau_3$ has elapsed from the transition of the input signal IN.

Subsequently, state changes of the first PMOS transistor MP1, the second PMOS transistor MP2, the third NMOS transistor MN3, the first NMOS transistor MN1, and the second NMOS transistor MN2 will be described.

$Vth_{(MP1)}$ and $Vth_{(MP2)}$ are threshold voltages of the PMOS transistors, and $Vth_{(MN1)}$, $Vth_{(MN2)}$, and $Vth_{(MN3)}$ are threshold voltages of the NMOS transistors.

Before time $t_0$, the first PMOS transistor MP1, the second PMOS transistor MP2, and the third NMOS transistor MN3 are turned off, and the first NMOS transistor MN1 and the second NMOS transistor MN2 are turned on. A low (0 V) output voltage $V_{OUT}$ is generated at the second terminal T2, and the switching transistor 102 is turned off.

At time $t_{10}$ corresponding to time $t_0$, when the VNGATE1 signal transitions from high to low, the second PMOS transistor MP2 is turned on and the first NMOS transistor MN1 is turned off.

At time $t_{11}$ corresponding to time $t_1$, when the VNGATE2 signal transitions from low to high, the third NMOS transistor MN3 is turned on.

At time $t_{12}$, when the VPGATE signal becomes lower than $Vcc-Vth_{(MP1)}$, the first PMOS transistor MP1 is turned on.

As the output voltage $V_{OUT}$ rises, a gate-source voltage Vgs of the third NMOS transistor MN3 decreases. When $V_{OUT}$ rises to $Va=Vcc-Vth_{(MN3)}-\Delta V$ at time $t_{13}$, the third NMOS transistor MN3 is turned off. It is desirable that Va is set to the plateau voltage of the GaN-HEMT.

At time $t_{14}$, when the VPGATE signal becomes lower than $Vth_{(MN2)}$, the second NMOS transistor MN2 is turned off.

Due to the state changes of the transistors MP1, MP2, MN3, MN1, and MN2 at times $t_{10}$ and $t_{14}$, the output voltage $V_{OUT}$ transitions from low to high, and the switching transistor 102 is turned on.

At time $t_{16}$, when VPGATE exceeds the threshold voltage $Vth_{(MN2)}$, the second NMOS transistor MN2 is turned on. Although VNGATE2 changes from high to low at time $t_4$, since the third NMOS transistor MN3 is turned off before that, no change occurs in the state of the third NMOS transistor MN3.

At time $t_{17}$, when the VPGATE signal exceeds $Vcc-Vth_{(MP1)}$, the first PMOS transistor MP1 is turned off.

Further, when the VNGATE1 signal exceeds $Vth_{(MN1)}$, the first NMOS transistor MN1 is turned on. These do not need to be simultaneous.

At time $t_{18}$, when the VNGATE1 signal exceeds $Vcc-Vth_{(MP2)}$, the second PMOS transistor MP2 is turned off.

Due to the state changes of the transistors MP1, MP2, MN3, MN1, and MN2 at times $t_{16}$ and $t_{18}$, the output voltage $V_{OUT}$ transitions from high to low, and the switching transistor 102 is turned off.

In this switching circuit 100, the voltage $V_{OUT}$ of the output line 202 (the second terminal T2) rises with a first slope during a first period $t_{10}$ to $t_{11}$, rises with a second slope larger than the first slope during the subsequent second period $t_{11}$ to $t_{13}$, and rises with a third slope smaller than the second slope during the subsequent third period $t_{13}$ to $t_{18}$.

As an example, the length of the second period is 200 ps to 800 ps. On the other hand, the length of the third period is determined depending on the gate capacitance of the switching transistor 102 and is typically 1 ns to 5 ns.

The switching circuit 100 transitions through the following states.

First state φ1: Period before time $t_{10}$ and period after time $t_{18}$

Second state φ2: Period $t_{10}$ to $t_{11}$

Third state φ3: Period $t_{11}$ to $t_{13}$

Fourth state φ4: Period $t_{13}$ to $t_{16}$

Fifth state φ5: Period $t_{16}$ to $t_{17}$

Sixth state φ6: Period $t_{17}$ to $t_{18}$

Figure 3:
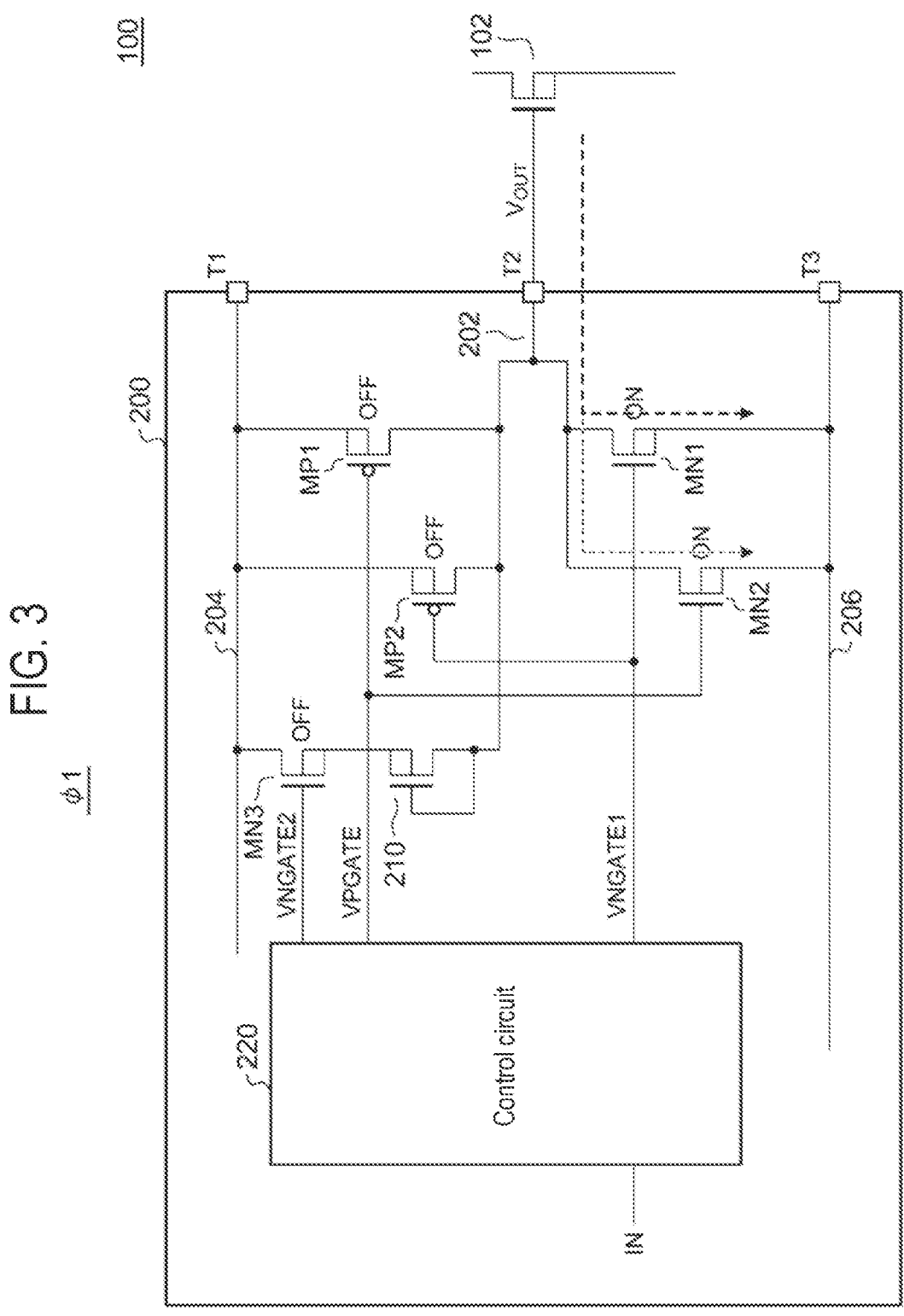
FIG. 3 is a diagram showing a first state $\varphi 1$.

FIG. 3 is a diagram showing the first state φ1. In FIGS. 3 to 8, broken lines represent effective current paths. In the first state φ1, the first NMOS transistor MN1 and the second NMOS transistor MN2 are in an on state, the gate capacitance of the switching transistor 102 can be discharged, and the gate voltage of the switching transistor 102 can be fixed at 0 V.

Figure 4:
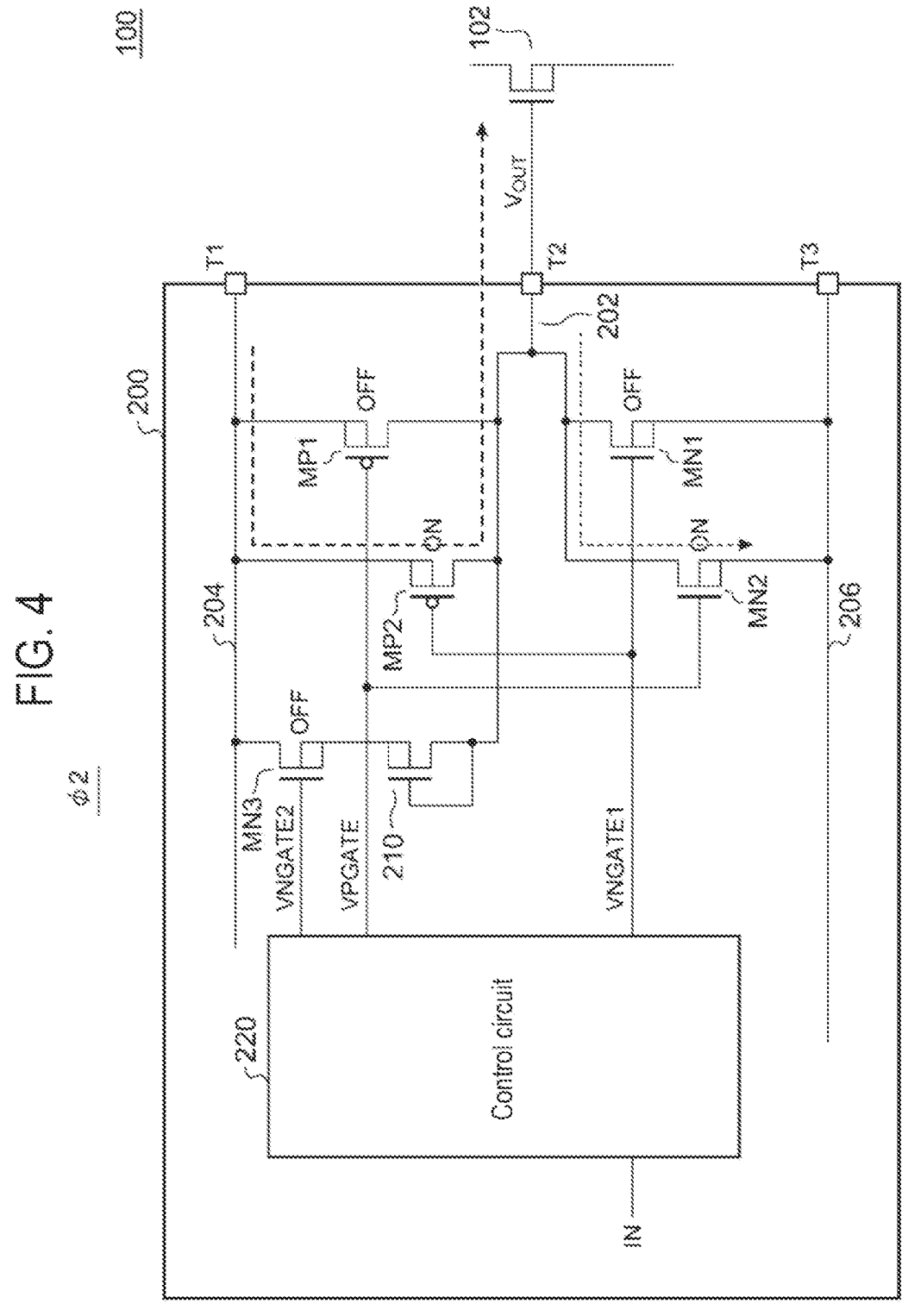
FIG. 4 is a diagram showing a second state $\varphi 2$.

FIG. 4 is a diagram showing the second state φ2. In the second state φ2, the second PMOS transistor MP2 and the second NMOS transistor MN2 are turned on. The current supply capability of the second PMOS transistor MP2 is low and the second NMOS transistor MN2 forms a through path to the ground, so that the driving capability of the driver circuit 200 is low. Therefore, the amount of charging current to the gate capacitance of the switching transistor 102 is small, and the output voltage $V_{OUT}$ can be gradually raised.

Figure 5:
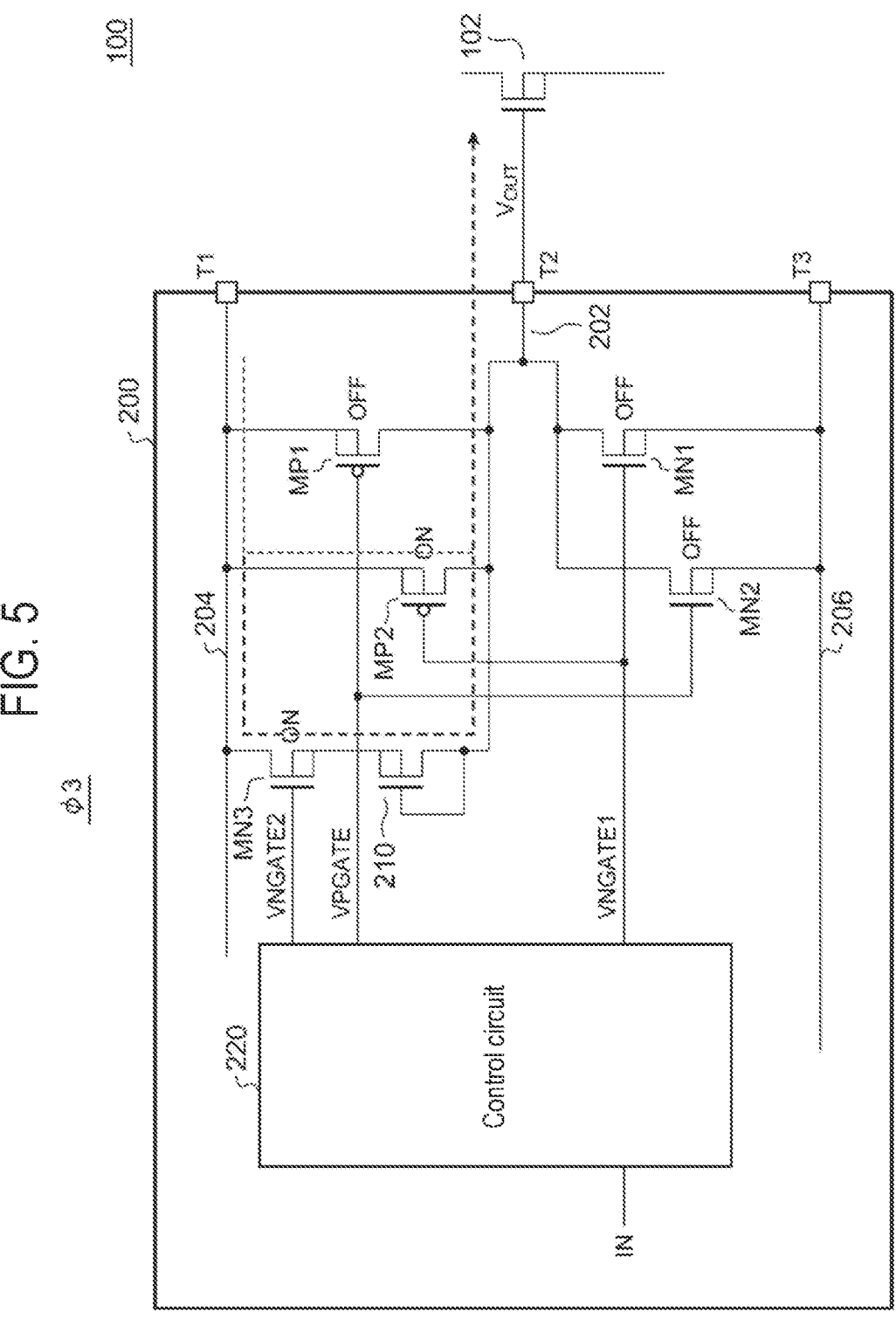
FIG. 5 is a diagram showing a third state $\varphi 3$.

FIG. 5 is a diagram showing the third state φ3. In the third state φ3, the third NMOS transistor MN3 having a high current supply capability is turned on. The current supply capability of the third NMOS transistor MN3 is designed to be as large as possible within a range in which the rising rate of the output voltage $V_{OUT}$ does not cause ringing. Further, in the third state φ3, when the output voltage $V_{OUT}$ rises to $Va=Vcc-(Vf+Vth_{(MN3)})$, no current flows through the third NMOS transistor MN3.

Figure 6:
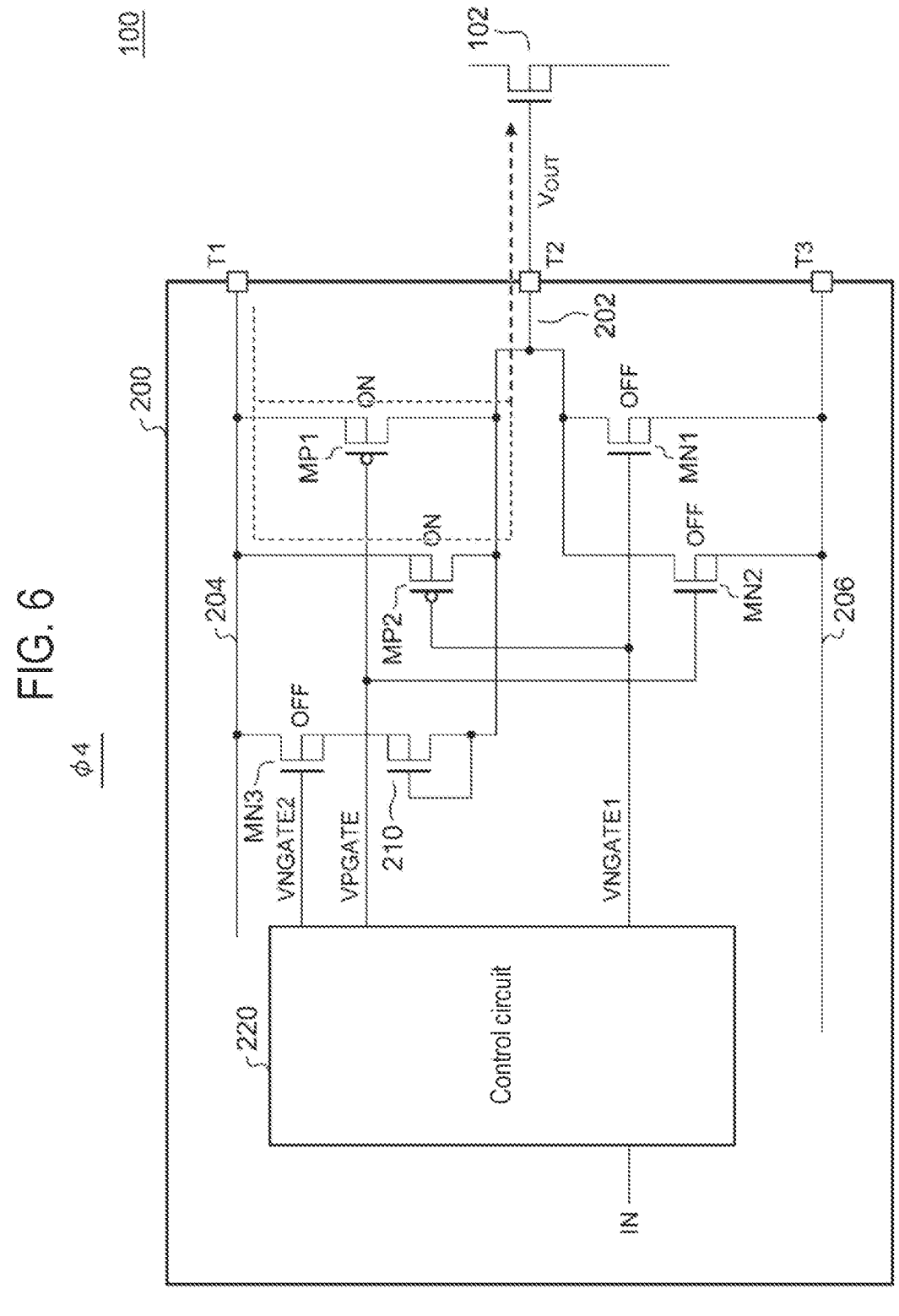
FIG. 6 is a diagram showing a fourth state $\varphi 4$.

FIG. 6 is a diagram showing the fourth state φ4. In the fourth state φ4, the first PMOS transistor MP1 and the second PMOS transistor MP2 are turned on. In this state, the output voltage $V_{OUT}$ can be maintained at the high voltage Vcc.

Figure 7:
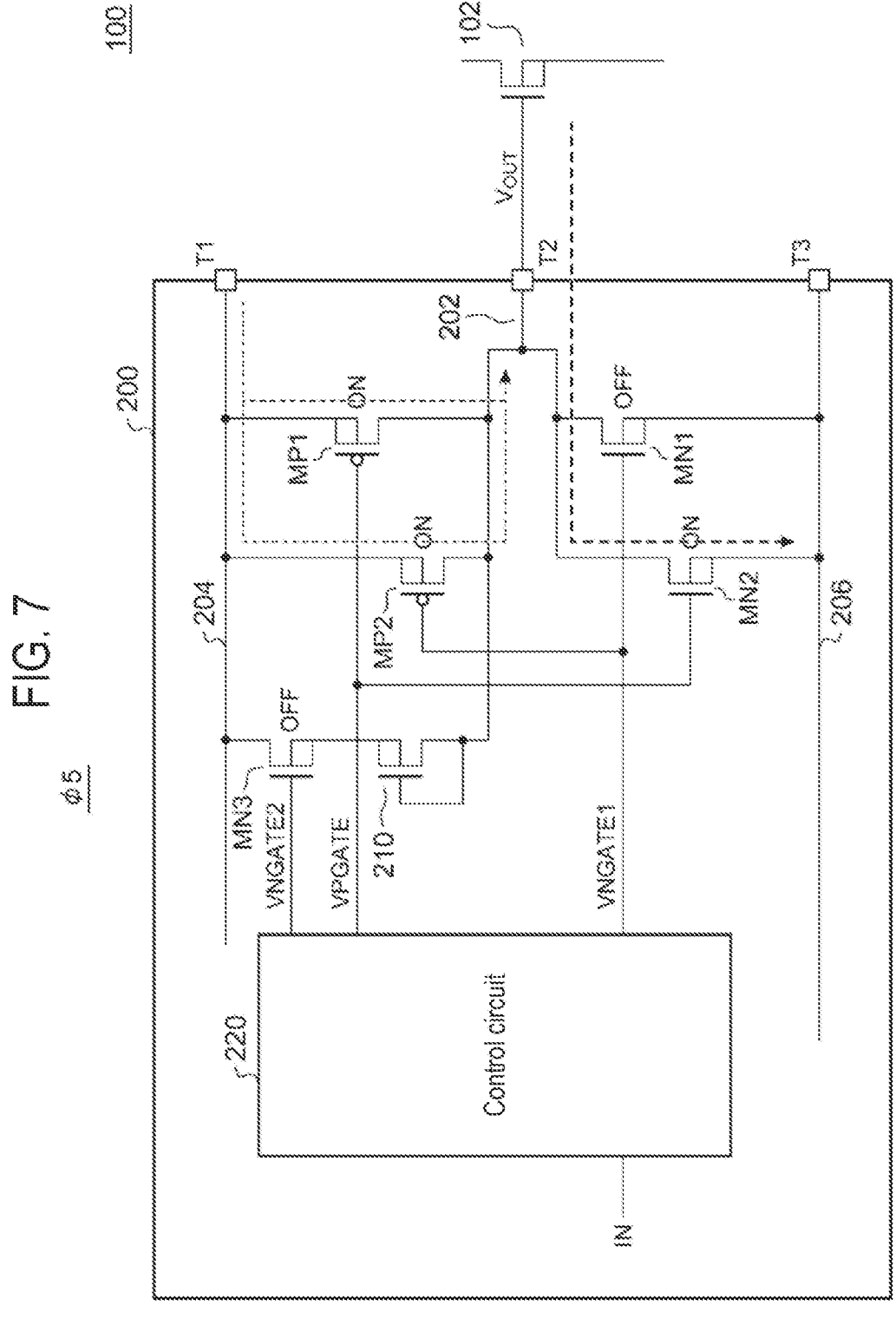
FIG. 7 is a diagram showing a fifth state $\varphi 5$.

FIG. 7 is a diagram showing the fifth state φ5. In the fifth state φ5, in addition to the second PMOS transistor MP2 and the second NMOS transistor MN2, the second NMOS transistor MN2 is turned on. The current supply capability of the second NMOS transistor MN2 is low and the first PMOS transistor MP1 and the second PMOS transistor MP2 form a through path from a power supply line, so that the driving capability of the driver circuit 200 is low. Therefore, the amount of discharging current from the gate capacitance of the switching transistor 102 is small, and the output voltage $V_{OUT}$ can be gradually lowered.

Figure 8:
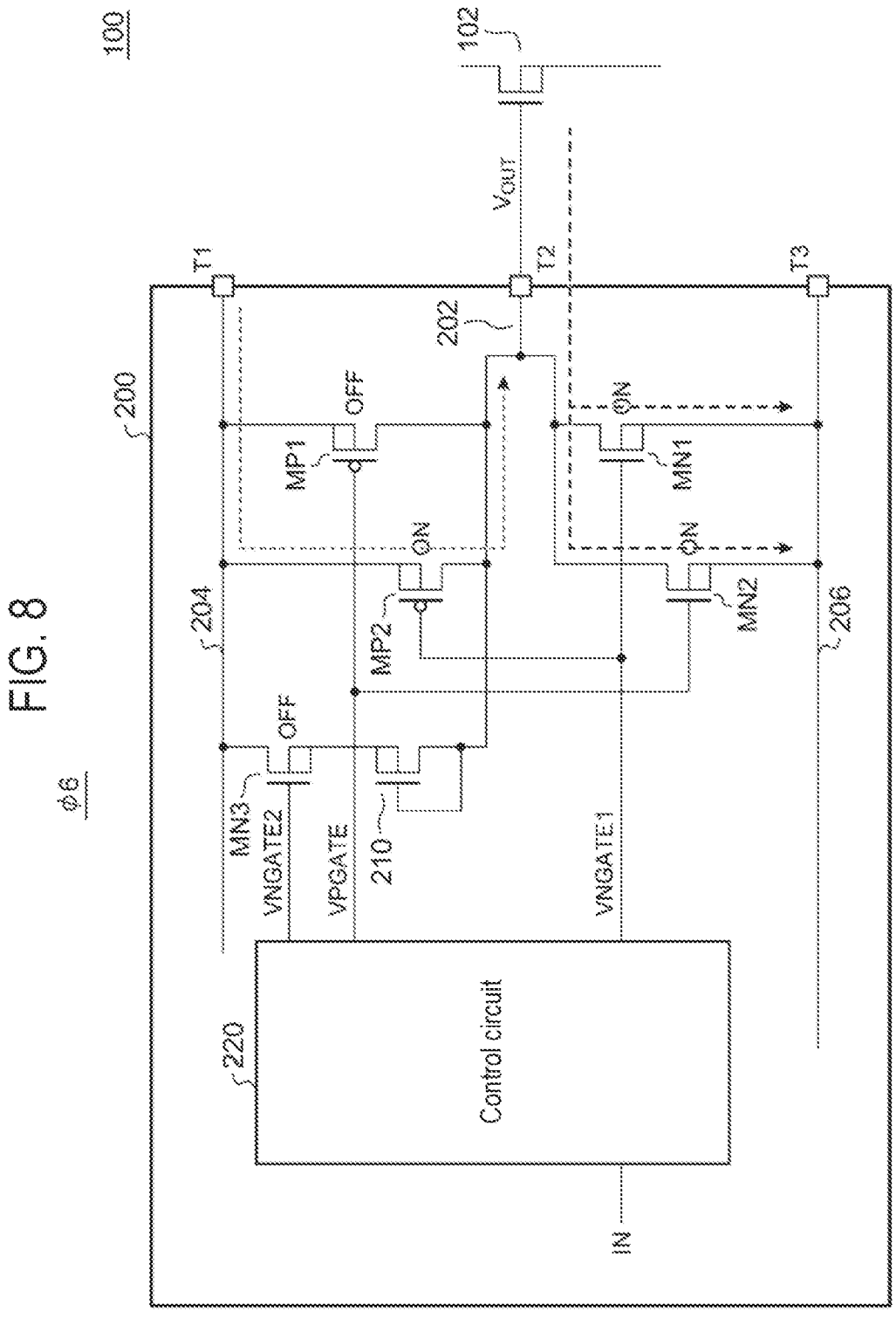
FIG. 8 is a diagram showing a sixth state $\varphi 6$.

FIG. 8 is a diagram showing the sixth state φ6. In the sixth state φ6, the first NMOS transistor MN1 is additionally turned on, and the first PMOS transistor MP1 is turned off. As a result, the output voltage $V_{OUT}$ can be lowered at a higher speed than in the fifth state φ5.

The above is the operation of the driver circuit 200. Subsequently, the effects of the driver circuit 200 will be described.

First Effect

Figure 9:
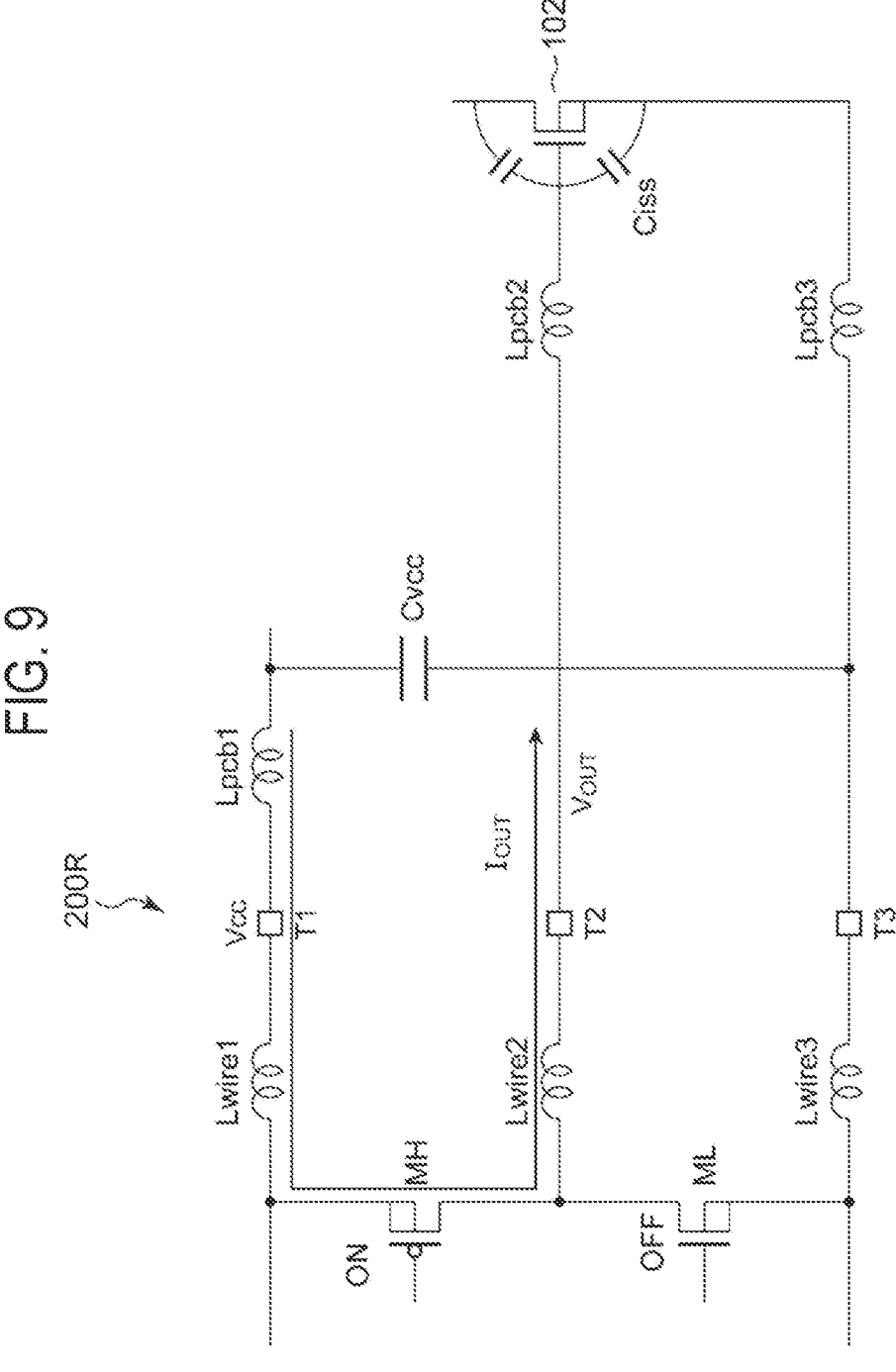
FIG. 9 is a diagram for explaining problem 1.

FIG. 9 is a diagram for explaining a first problem. FIG. 9 shows an equivalent circuit diagram of a driver circuit 200R during turn-on operation of the switching transistor 102. The high-side transistor MH is a simplified representation of a transistor (or transistor group) connected between the first terminal T1 and the second terminal T2, and a low-side transistor ML is a simplified representation of a transistor (or transistor group) connected between the second terminal T2 and the third terminal T3.

When the switching transistor 102 is turned on, the high-side transistor MH is turned on, a current flows through a path of Lpcb1, Lwire1, MH, Lwire2, and Lpcb2, and a drive current $I_{OUT}$ (charging current) is supplied to the gate capacitance Ciss of the switching transistor 102. When the drive current $I_{OUT}$ changes sharply during charging, $dI_{OUT}/dt$ increases, so that a electromotive force $L \times dI_{OUT}/dt$ generated in the parasitic inductance Lwire of a wire and the parasitic inductance Lpcb of a wiring of a printed circuit board increases, which results in ringing of the output voltage $V_{OUT}$ (problem 1).

Regarding this problem 1, in the present embodiment, the drive current $I_{OUT}$ sourced to the gate of the switching transistor 102 is changed stepwise in three stages while the switching transistor 102 is being turned on. As a result, the rate of change $dI_{OUT}/dt$ of the drive current becomes small, so that the ringing of the output voltage $V_{OUT}$ can be suppressed.

Second Effect

Figure 10:
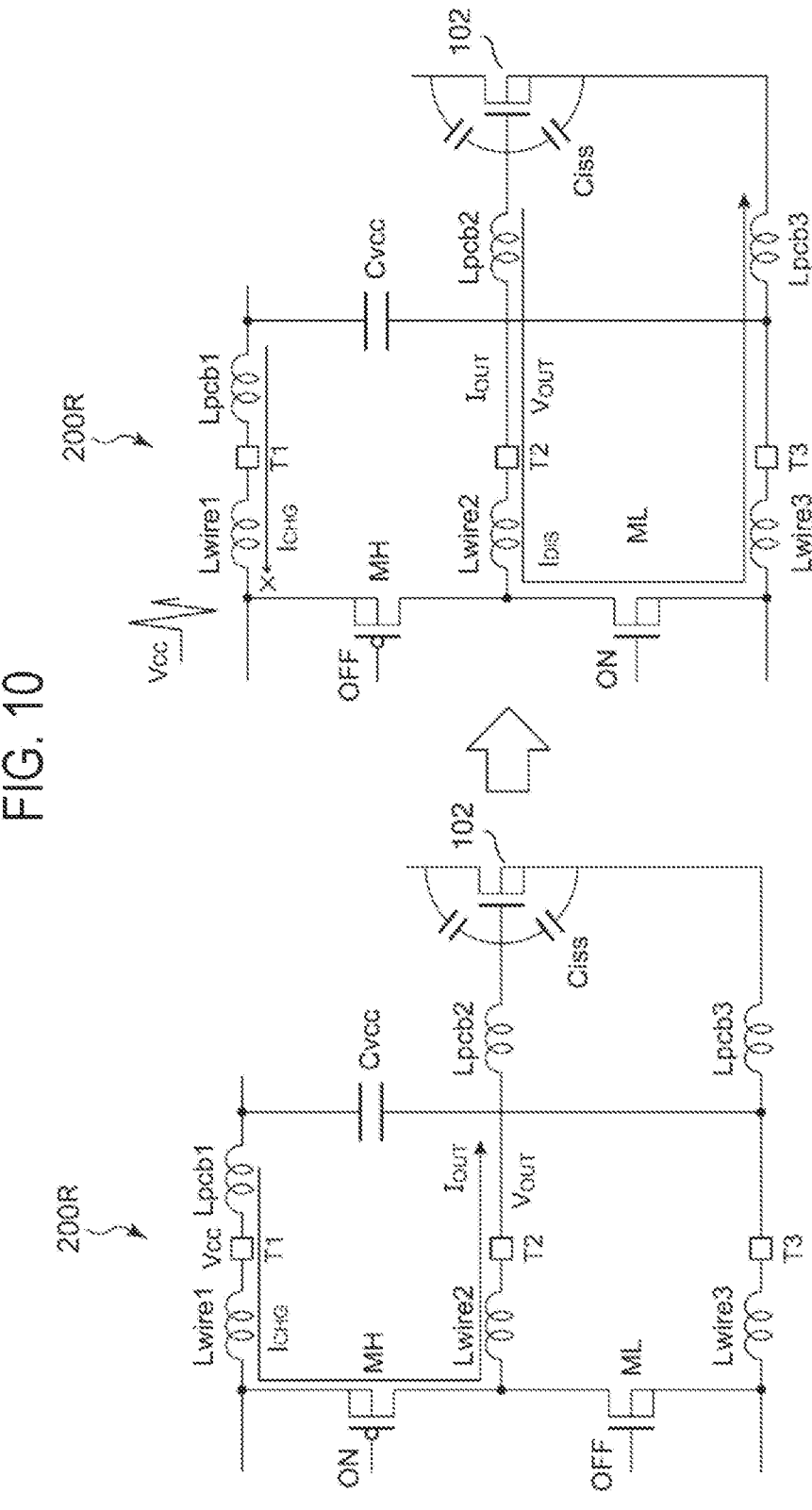
FIG. 10 is a diagram for explaining problem 2.

FIG. 10 is a diagram for explaining a second problem. The left side in FIG. 10 shows the driver circuit 200R when turning on the switching transistor 102, and the right side in FIG. 10 shows the driver circuit 200R when turning off the switching transistor 102.

As shown on the left side in FIG. 10, during the turn-on operation, the high-side transistor MH is turned on, the low-side transistor ML is turned off, and the charging current $I_{OUT}$ is supplied to the gate of the switching transistor 102.

When switching the switching transistor 102 with a very short on-time (that is, a small duty cycle), while the charging current shown in FIG. 10 is flowing, a transition is made to a discharging state in which the high-side transistor MH is turned off and the low-side transistor ML transitions to a discharged state, which is low. Since a current $I_{CHG}$ flowing through Lpcb1 and Lwire1 is cut off and becomes zero, $dI_{CHG}/dt$ increases, thereby generating a back electromotive force of $(Lpcb1+Lwire1) \times dI_{CHG}/dt$. This back electromotive force causes ringing in the power supply voltage Vcc of the first terminal T1 (problem 2).

In the present embodiment, in a situation where the on-time of the switching transistor 102 is short, a transition occurs from any one of the second state φ2 to the fourth state φ4 to the fourth state φ4 and the fifth state φ5. As described above, in the fourth state φ4 and the fifth state φ5, since at least one of the first PMOS transistor MP1 and the second PMOS transistor MP2 is turned on, the current $I_{CHG}$ flowing through the parasitic inductance Lpcb1+Lwire1 in FIG. 10 can continue to flow through the first PMOS transistor MP1 and the second PMOS transistor MP2. Since $dI_{CHG}/dt$ can be reduced and the back electromotive force is reduced, the ringing of the power supply voltage Vcc can be suppressed.

Third Effect

The third effect becomes clear by comparison with a comparative technique in which the level shift element 210 is omitted. When the level shift element 210 is omitted, a reaching point Va' of the output voltage $V_{OUT}$ in the third state φ3 becomes:

$$Va' = Vcc - Vth_{(MN3)}.$$

When the threshold voltage $Vth_{(MN3)}$ of the third NMOS transistor MN3 is small (for example, 0.8 V), the reaching point Va' becomes very close to the power supply voltage Vcc.

In the embodiment, by inserting the level shift element 210 in series with the third NMOS transistor MN3, the reaching point Va becomes lower by a voltage $\Delta V$ of the level shift element 210 than in the comparative technique. As a result, even if the rising rate of the output voltage $V_{OUT}$ in the third state φ3 is increased, the ringing is less likely to occur.

Figure 11:
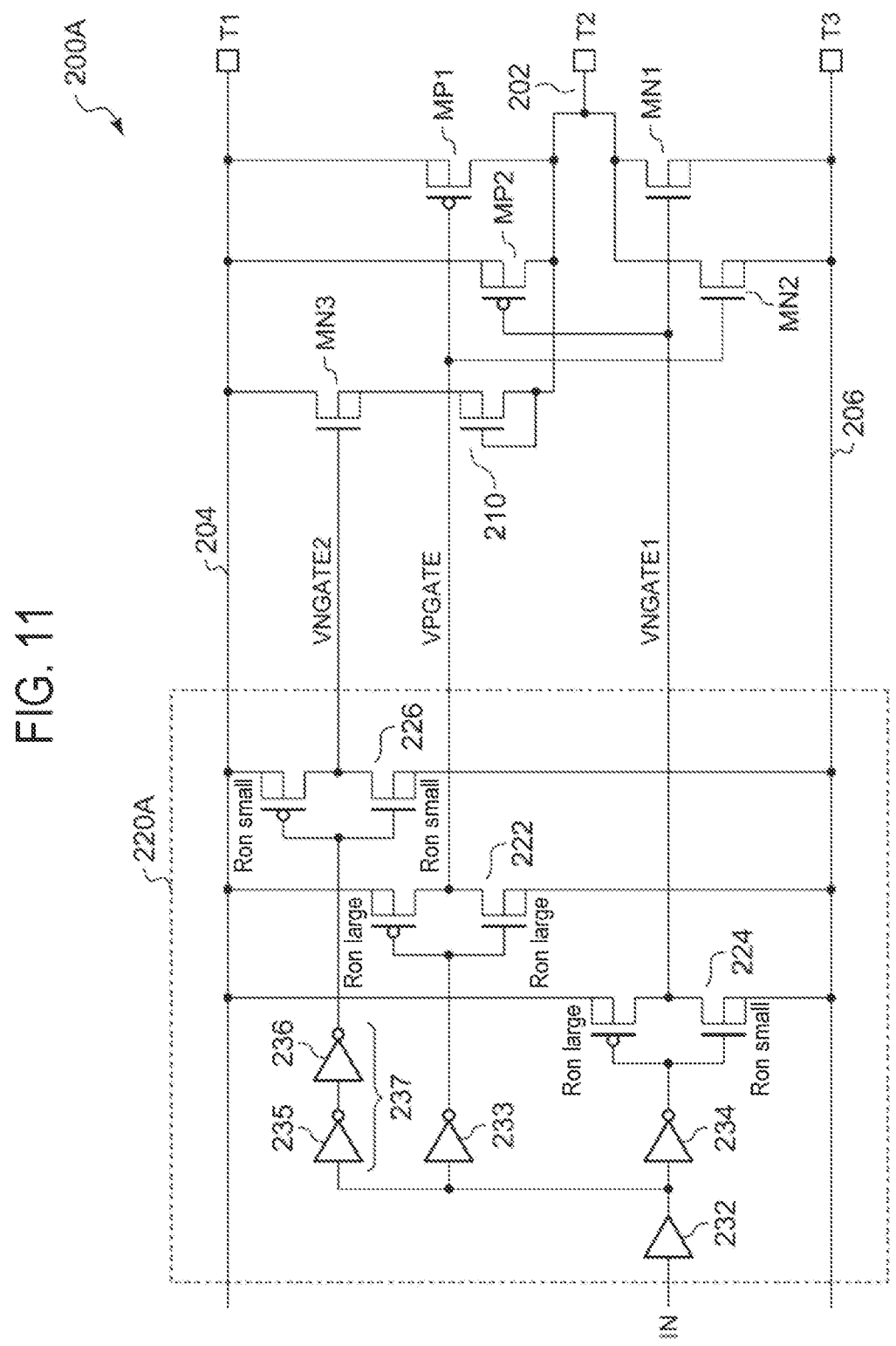
FIG. 11 is a circuit diagram of a driver circuit including a control circuit according to an embodiment.

FIG. 11 is a circuit diagram of a driver circuit 200A including a control circuit 220A according to an embodiment. The control circuit 220A is composed of a combination of inverters and buffers.

An input buffer 232 receives an input signal IN. An inverter 233 inverts the output of the input buffer 232. A first output inverter 222 inverts the output of the inverter 233 and outputs it as a VPGATE signal. The on-resistance of a PMOS transistor and the on-resistance of an NMOS transistor of the first output inverter 222 are substantially equal to each other. As a result, the upward slope and downward slope of the VPGATE signal become approximately the same. Further, the on-resistance is designed using the MOS-FET size W/L (gate width/gate length) as a parameter.

An inverter 234 inverts the output of the input buffer 232. A second output inverter 224 inverts the output of the inverter 234 and outputs it as a VNGATE1 signal. The on-resistance of a PMOS transistor of the second output inverter 224 is substantially equal to the on-resistances of the PMOS transistor and the NMOS transistor of the first output inverter 222. Further, the on-resistance of an NMOS transistor of the second output inverter 224 is lower than the on-resistance of the PMOS transistor of the second output inverter 224. As a result, the VNGATE1 signal falls steeply and rises at a rate comparable to that of the VPGATE signal.

Inverters 235 and 236 constitute a buffer 237 which delays the output of the input buffer 232. A third output inverter 226 inverts the output of the inverter 236 and outputs it as a VNGATE2 signal. The on-resistance of a PMOS transistor and the on-resistance of an NMOS transistor of the third output inverter 226 are both designed to be low. As a result, the VNGATE2 signal falls steeply and rises steeply. Further, since the buffer 237 including the two inverters 235 and 236 causes a longer delay than other paths, the rise of the VNGATE2 signal is delayed by $\tau_1$ with respect to the input signal IN, as shown in FIG. 2.

The on-resistances of a plurality of MOS transistors indicated as Ron Large in FIG. 11 may be substantially equal to each other, and the on-resistances of a plurality of MOS transistors indicated as Ron Small therein may be substantially equal to each other, but the present disclosure is not limited thereto.

According to the control circuit 220A of FIG. 11, the VPGATE signal, the VNGATE1 signal, and the VNGATE2 signal as shown in FIG. 2 can be generated, and the transistors MP1, MP2, and MN3 and the transistors MN1 and MN2 can be controlled.

(Applications)

Subsequently, the applications of the driver circuit 200 will be described.

Figure 12:
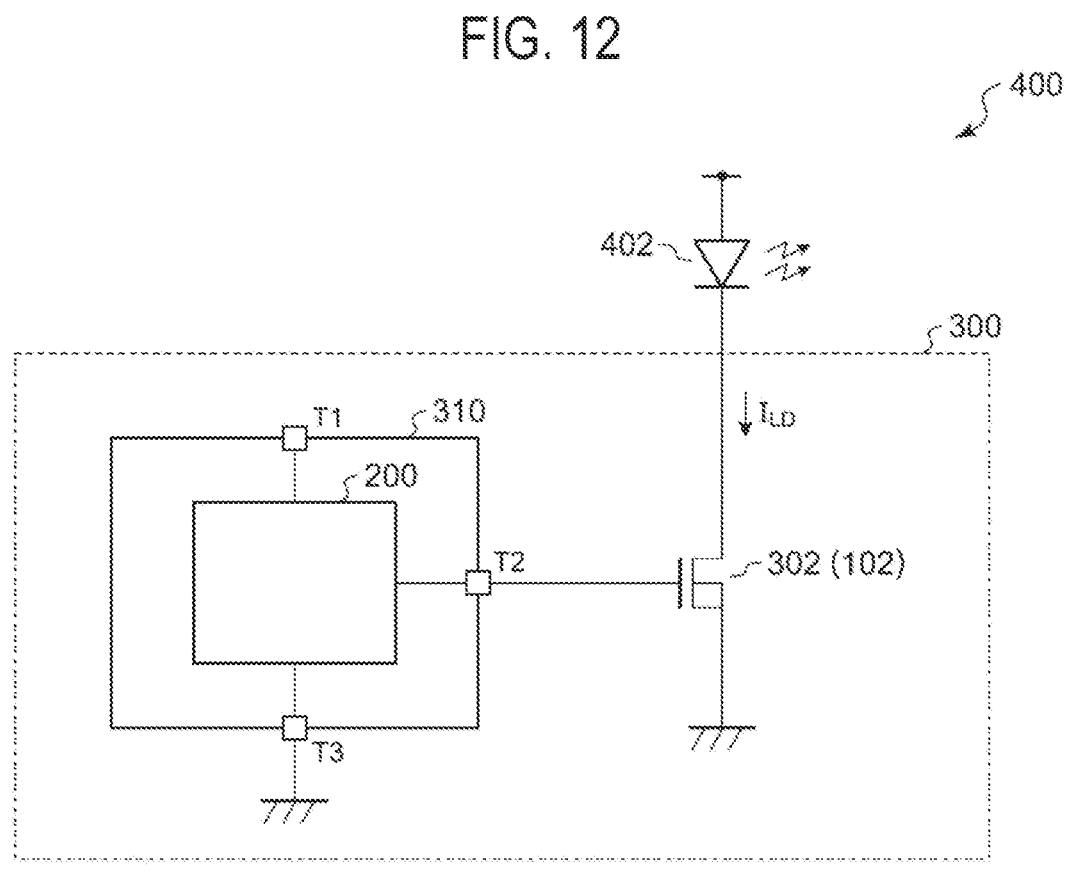
FIG. 12 is a circuit diagram of a light emitting device.

FIG. 12 is a circuit diagram of a light emitting device 400. The light emitting device 400 includes a semiconductor laser 402 and a laser driver circuit 300 that drives the semiconductor laser 402. The laser driver circuit 300 includes a drive transistor 302, which is a GaN-HEMT, and a gate driver circuit 310. The drive transistor 302 corresponds to the above-described switching transistor 102 and the gate driver circuit 310 includes the above-described driver circuit 200.

By using the driver circuit 200, since the drive transistor 302 can be switched at a high speed while suppressing ringing, it is possible to cause the semiconductor laser 402 to emit pulses with a pulse width on the order of ns.

Figure 13:
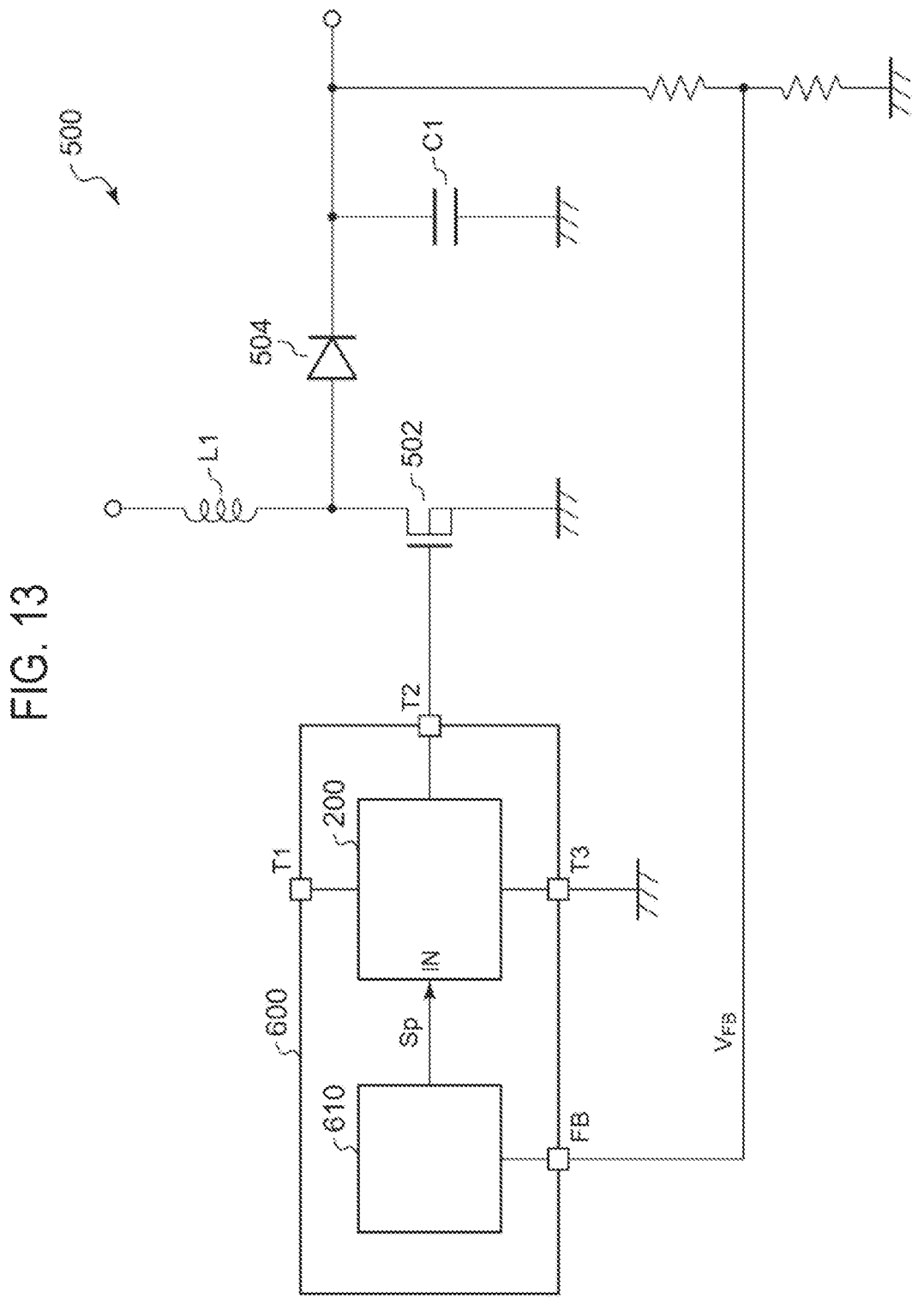
FIG. 13 is a circuit diagram of a DC/DC converter.

FIG. 13 is a circuit diagram of a DC/DC converter 500. The DC/DC converter 500 is a boost converter and includes a low-side transistor 502, an inductor L1, a rectifying element 504, an output capacitor C1, and a controller circuit 600. The low-side transistor 502 corresponds to the above-described switching transistor 102.

The controller circuit 600 includes a feedback circuit 610 and a driver circuit 200. The feedback circuit 610 feedback-controls the duty cycle or frequency of a pulse modulation signal Sp so that a feedback signal $V_{FB}$ according to the output of the DC/DC converter 500 approaches a target level of the DC/DC converter 500. The driver circuit 200 receives the pulse modulation signal Sp as an input signal IN and drives the low-side transistor 502. Further, the rectifying element 504 may be a synchronous rectifying transistor instead of a diode.

The driver circuit 200 can be used to drive GaN-HEMTs that constitute not only boost converters but also other converters and inverters.

MODIFICATIONS

The above-described embodiments are merely examples, and those skilled in the art will understand that various modifications can be made to the combinations of their constituent elements and processing processes. Hereinafter, such modifications will be described.

Modification 1

The level shift element 210 is not limited to a diode but may be a MOS transistor that can be switched in synchronization with the third NMOS transistor MN3.

Modification 2

In the waveform diagram of FIG. 2, the timing $t_{12}$ when the first PMOS transistor MP1 is turned on is before the time $t_{13}$ when the output voltage $V_{OUT}$ reaches the voltage Va, but the present disclosure is not limited thereto. Since the rate at which the output voltage $V_{OUT}$ changes is determined by the gate capacitance Ciss connected to the second terminal T2, if the gate capacitance Ciss is small, the timings of $t_2$ and $t_3$ are exchanged.

Modification 3

The configuration of the control circuit 220A in FIG. 11 is an example, and those skilled in the art will understand that various modifications are included in the present disclosure. For example, in FIG. 11, the slopes of the VPGATE signal and the VNGATE signal are designed to make the on-resistances of the PMOS transistor and the NMOS transistor of the inverter different, but the present disclosure is not limited thereto. For example, the rising slope may be adjusted by inserting a resistor in series with the PMOS transistor, or the falling slope may be adjusted by inserting a resistor in series with the NMOS transistor.

Although the present disclosure has been described using specific terms based on the embodiments, the embodiments merely illustrate the principles and applications of the present disclosure, and many modifications and rearrangements are recognized in the embodiments without departing from the spirit of the present disclosure defined in the claims.

SUPPLEMENTARY NOTES

The following supplementary notes are disclosed in the present disclosure.

Supplementary Note 1

A driver circuit that drives a switching transistor which is a GaN-HEMT (High Electron Mobility Transistor), including:

an output line connected to a gate of the switching transistor;

a low-side line connected to a source of the switching transistor;

a high-side line;

a first PMOS transistor that is connected between the high-side line and the output line and receives a P gate signal at a gate of the first PMOS transistor;

a first NMOS transistor that is connected between the output line and the low-side line and receives a first N gate signal at a gate of the first NMOS transistor;

a second PMOS transistor that is connected between the high-side line and the output line and receives the first N gate signal at a gate of the second PMOS transistor;

a second NMOS transistor that is connected between the output line and the low-side line and receives the P gate signal at a gate of the second NMOS transistor;

a third NMOS transistor that is connected between the high-side line and the output line and receives a second N gate signal at a gate of the third NMOS transistor; and a control circuit that generates the P gate signal, the first N gate signal, and the second N gate signal.

Supplementary Note 2

The driver circuit of Supplementary Note 1, wherein in a turn-on operation of the switching transistor, the first N gate signal transitions to low, subsequently the second N gate signal transitions to high, and subsequently the P gate signal transitions to low more gradually than the transition of the first N gate signal and the transition of the second N gate signal.

Supplementary Note 3

The driver circuit of Supplementary Note 1 or 2, wherein in a turn-off operation of the switching transistor, the P gate signal gradually transitions to high, and subsequently the second N gate signal transitions to low and the first N gate signal gradually transitions to high.

Supplementary Note 4

The driver circuit of any one of Supplementary Notes 1 to 3, further including: a level shift element connected in series with the third NMOS transistor between the high-side line and the output line.

Supplementary Note 5

The driver circuit of Supplementary Note 4, wherein the level shift element includes a diode.

Supplementary Note 6

The driver circuit of Supplementary Note 4, wherein the level shift element is a MOS transistor that can be switched in synchronization with the third NMOS transistor.

Supplementary Note 7

The driver circuit of any one of Supplementary Notes 1 to 6, wherein the control circuit includes:
 a first output inverter whose output is connected to the gate of the first PMOS transistor and the gate of the second NMOS transistor and that outputs the P gate signal;
 a second output inverter whose output is connected to the gate of the first NMOS transistor and the gate of the second PMOS transistor and that outputs the first N gate signal; and
 a third output inverter whose output is connected to the gate of the third NMOS transistor and that outputs the second N gate signal,
 wherein an on-resistance of a PMOS transistor of the second output inverter is larger than an on-resistance of an NMOS transistor of the second output inverter.

Supplementary Note 8

The driver circuit of Supplementary Note 7, wherein an on-resistance of an NMOS transistor of the first output inverter is larger than the on-resistance of the NMOS transistor of the second output inverter.

Supplementary Note 9

The driver circuit of Supplementary Note 8, wherein an on-resistance of a PMOS transistor of the third output inverter is smaller than the on-resistance of the PMOS transistor of the second output inverter, and an on-resistance of an NMOS transistor of the third output inverter is smaller than the on-resistance of the NMOS transistor of the first output inverter.

Supplementary Note 10

The driver circuit of any one of Supplementary Notes 1 to 9, wherein in the turn-on operation of the switching transistor, a voltage of the output line rises with a first slope in a first period, rises with a second slope larger than the first slope during a subsequent second period, and rises with a third slope smaller than the second slope during a subsequent third period.

Supplementary Note 11

The driver circuit of Supplementary Note 10, wherein a length of the second period is 200 ps to 800 ps.

Supplementary Note 12

The driver circuit of Supplementary Note 10 or 11, wherein a length of the third period is 1 ns to 5 ns.

Supplementary Note 13

The driver circuit of any one of Supplementary Notes 1 to 12, which is monolithically integrated on one semiconductor substrate.

Supplementary Note 14

A laser driver circuit including a driver circuit of any one of Supplementary Notes 1 to 13.

Supplementary Note 15

A controller circuit of a converter, including a driver circuit of any one of Supplementary Notes 1 to 13.

The above description is merely an example. Those skilled in the art will appreciate that additional possible combinations and substitutions are possible beyond the components and methods (manufacturing processes) listed for the purposes of illustrating the techniques of the present disclosure. The present disclosure is intended to cover all alternatives, modifications, and changes that fall within the scope of the present disclosure, including the claims.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A driver circuit that drives a switching transistor which is a GaN-HEMT (High Electron Mobility Transistor), comprising:
 an output line connected to a gate of the switching transistor;
 a low-side line connected to a source of the switching transistor;
 a high-side line;
 a first PMOS transistor that is connected between the high-side line and the output line and receives a P gate signal at a gate of the first PMOS transistor;
 a first NMOS transistor that is connected between the output line and the low-side line and receives a first N gate signal at a gate of the first NMOS transistor;
 a second PMOS transistor that is connected between the high-side line and the output line and receives the first N gate signal at a gate of the second PMOS transistor;
 a second NMOS transistor that is connected between the output line and the low-side line and receives the P gate signal at a gate of the second NMOS transistor;

a third NMOS transistor that is connected between the high-side line and the output line and receives a second N gate signal at a gate of the third NMOS transistor; and a control circuit that generates the P gate signal, the first N gate signal, and the second N gate signal, wherein in a turn-on operation of the switching transistor, the first N gate signal transitions to low, subsequently the second N gate signal transitions to high, and subsequently the P gate signal transitions to low more gradually than the transition of the first N gate signal and the transition of the second N gate signal.

2. A driver circuit that drives a switching transistor which is a GaN-HEMT (High Electron Mobility Transistor), comprising:

an output line connected to a gate of the switching transistor;

a low-side line connected to a source of the switching transistor;

a high-side line;

a first PMOS transistor that is connected between the high-side line and the output line and receives a P gate signal at a gate of the first PMOS transistor;

a first NMOS transistor that is connected between the output line and the low-side line and receives a first N gate signal at a gate of the first NMOS transistor;

a second PMOS transistor that is connected between the high-side line and the output line and receives the first N gate signal at a gate of the second PMOS transistor;

a second NMOS transistor that is connected between the output line and the low-side line and receives the P gate signal at a gate of the second NMOS transistor;

a third NMOS transistor that is connected between the high-side line and the output line and receives a second N gate signal at a gate of the third NMOS transistor; and a control circuit that generates the P gate signal, the first N gate signal, and the second N gate signal, wherein in a turn-off operation of the switching transistor, the P gate signal gradually transitions to high, and subsequently the second N gate signal transitions to low and the first N gate signal gradually transitions to high.

3. The driver circuit of claim 1, further comprising a level shift element connected in series with the third NMOS transistor between the high-side line and the output line.

4. The driver circuit of claim 3, wherein the level shift element includes a diode.

5. The driver circuit of claim 3, wherein the level shift element is a MOS transistor that is capable of being switched in synchronization with the third NMOS transistor.

6. The driver circuit of claim 1, wherein the control circuit includes:

a first output inverter whose output is connected to the gate of the first PMOS transistor and the gate of the second NMOS transistor and that outputs the P gate signal;

a second output inverter whose output is connected to the gate of the first NMOS transistor and the gate of the second PMOS transistor and that outputs the first N gate signal; and a third output inverter whose output is connected to the gate of the third NMOS transistor and that outputs the second N gate signal, wherein an on-resistance of a PMOS transistor of the second output inverter is larger than an on-resistance of an NMOS transistor of the second output inverter.

7. The driver circuit of claim 6, wherein an on-resistance of an NMOS transistor of the first output inverter is larger than the on-resistance of the NMOS transistor of the second output inverter.

8. The driver circuit of claim 7, wherein an on-resistance of a PMOS transistor of the third output inverter is smaller than the on-resistance of the PMOS transistor of the second output inverter, and an on-resistance of an NMOS transistor of the third output inverter is smaller than the on-resistance of the NMOS transistor of the first output inverter.

9. A driver circuit that drives a switching transistor which is a GaN-HEMT (High Electron Mobility Transistor), comprising:

an output line connected to a gate of the switching transistor;

a low-side line connected to a source of the switching transistor;

a high-side line;

a first PMOS transistor that is connected between the high-side line and the output line and receives a P gate signal at a gate of the first PMOS transistor;

a first NMOS transistor that is connected between the output line and the low-side line and receives a first N gate signal at a gate of the first NMOS transistor;

a second PMOS transistor that is connected between the high-side line and the output line and receives the first N gate signal at a gate of the second PMOS transistor;

a second NMOS transistor that is connected between the output line and the low-side line and receives the P gate signal at a gate of the second NMOS transistor;

a third NMOS transistor that is connected between the high-side line and the output line and receives a second N gate signal at a gate of the third NMOS transistor; and a control circuit that generates the P gate signal, the first N gate signal, and the second N gate signal, wherein in a turn-on operation of the switching transistor, a voltage of the output line rises with a first slope in a first period, rises with a second slope larger than the first slope during a subsequent second period, and rises with a third slope smaller than the second slope during a subsequent third period.

10. The driver circuit of claim 9, wherein a length of the second period is 200 ps to 800 ps.

11. The driver circuit of claim 9, wherein a length of the third period is 1 ns to 5 ns.

12. The driver circuit of claim 1, which is monolithically integrated on one semiconductor substrate.

13. A laser driver circuit comprising a driver circuit of claim 1.

14. A controller circuit of a converter, comprising a driver circuit of claim 1.

* * * * *